United States Patent [19]
Vogt

[11] 4,008,487
[45] Feb. 15, 1977

[54] SEMICONDUCTOR COMPONENT WITH PRESSURE CONTACT

[75] Inventor: Herbert Vogt, Munich, Germany

[73] Assignee: Siemens Aktiengesellschaft, Munich, Germany

[22] Filed: July 15, 1975

[21] Appl. No.: 596,139

[30] Foreign Application Priority Data
July 24, 1974 Germany ............ 2435637

[52] U.S. Cl. .................. 357/81; 357/68; 357/79
[51] Int. Cl.² ............ H01L 23/02; H01L 23/48; H01L 23/42
[58] Field of Search .......... 357/68, 79, 81

[56] References Cited
UNITED STATES PATENTS
2,889,498   6/1959   Boyer et al. .............. 357/82

Primary Examiner—Edward J. Wojciechowicz
Attorney, Agent, or Firm—C. L. Menzemer

[57] ABSTRACT

The present invention is directed to a semiconductor device incorporating a semiconductor element which is provided with a housing having at least a base member, a top member and an insulator member which connects the base and top members, the housing having enclosed within it a semiconducting element which is clamped in place between two electrodes by means of at least one spring, the semiconducting element being electrically connected to the electrodes by a thin layer of soft solder, the semiconductor device being provided with a current supply lead which is in contact with at least one of the exterior faces of the housing.

6 Claims, 5 Drawing Figures

SEMICONDUCTOR COMPONENT WITH PRESSURE CONTACT

BACKGROUND OF THE INVENTION

1. Field of the Invention

The present invention relates to semiconductor devices and more particularly to mounting of discrete semiconductor devices.

2. Description of the Prior Art:

The present invention is directed to a semiconductor device incorporating a semiconductor element which is provided with a housing having at least a base member, a top member and an insulator member which connects the base and top members, the housing having enclosed within it a semiconducting element which is clamped in place between two electrodes by means of at least one spring, the semiconducting element being electrically connected to the electrodes by a thin layer of soft solder, the semiconductor device being provided with a current supply lead which is in contact with at least one of the exterior faces of the housing.

A semiconductor arrangement of this type has been described, for example, in German Pat. No. 1,439,304. In that arrangement, the semiconductor element is connected on one side via a layer of soft solder to an electrode and, on the other side, via a layer of soft solder, to the base member of the housing which serves as another electrode. The semiconductor is clamped between the electrodes by means of a saddle spring located in the housing. The outside face of the housing wall is provided with grooves which become deformed on being pressed into a recess in a current supply lead or into a cooling body or heat sink, thereby providing a lower electrical resistance and lower resistance to heat transfer.

The above-mentioned type of union between the housing and the current supply lead or heat sink is, however, relatively expensive on account of the relative hardness of the housing wall. In addition, the above-described type of union is difficult to release because, when inserting the housing in the above-mentioned recess, cold-welding takes place with the material constituting the current supply lead.

A simple releasable joint between a housing and a current-supply member or a heat sink is described, for example, in German Patent No. 1,276,209. In the arrangement described, a flat face of the housing abuts against an equally flat face of a supply electrode and is held firmly against the latter under high pressure by means of a spring. At the same time, the spring provides the interior contact pressure between the semiconductor element and the housing.

However, as far as the above-mentioned semiconductor arrangement with its soft solder layers subjected to pressure is concerned, this solution can only be employed when a separate spring system is employed for providing the interior and exterior contact pressures, because the solder layer can only endure an appreciably lower pressure than is necessary for the outside contact.

SUMMARY OF THE INVENTION

The present invention provides a semiconductor device of the above-mentioned type in such a way that only one spring system is necessary to produce the internal and external contact pressures, the device being such that the surface of the housing making contact with the current supply lead is of sufficient size.

The invention is so characterized that the abovementioned exterior surfaces subtend an angle greater than 0° and less than 45° with the normals to the main faces of the semiconductor element, that the current supply lead is at least provided with a counter, or mating-face which matches one of the outer faces which subtends with the normals the same angle as the external faces, and that the spring element is located outside the housing and that the housing presses against the current supply lead.

Advantageously, the base of the housing can be provided with a truncated cone which seats in a conical recess provided in the current supply lead. A reverse solution is possible in which the housing base is provided with a conical recess in which is seated a truncated cone associated with the current supply lead.

A particularly simple solution is obtained when the outer side of the housing wall is made conical so that the housing is seated in a conical recess provided in the current supply lead.

Advantageously, the above-mentioned angle lies between 1° and 12°.

A semiconductor device has already been described in U.S. Pat. No. 2,889,498 in which the housing of the semiconductor device is provided with a truncated cone which is seated in a conical hole in a current supply lead. However, with this semiconductor device, the semiconductor element is soldered between the current supply electrodes and is not under spring pressure so that, in this case, the problem forming the basis of the present invention does not arise.

DESCRIPTION OF THE PREFERRED EMBODIMENTS

The invention will now be dsecribed in detail on the basis of a number of examples illustrated in FIGS. 1 to 5.

Figure 1:
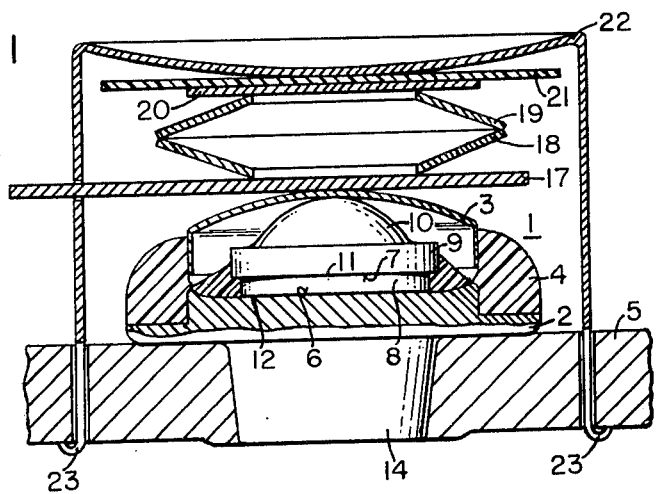
FIG. 1 shows a vertical cross-section through a semiconductor device containing a semiconductor element and a mounting apparatus in accordance with a first practical example.

In FIG. 1, the semiconductor device housing is denoted by 1.

The FIGURE shows a metallic base member 2, a top member or metallic cover 3 and an insulator 4 which unites the base member 2 and the top member 3. In this case, the insulating ring 4 is made from a thermoplastic material. One of the outside faces of the device 1, namely the base member 2, is in contact with a bottom current supply lead 5. Current supply lead 5 can also consist of a heat sink or cooling body. Base 2 is provided with a conical section or frustrum 14 which is seated in a conical recess 15 (FIG. 2) of current supply lead 5. Part of the outside surface of base 2, namely the peripheral or conical face of frustrum 14, has a contact interface with surface 16 of conical recess 15.

Enclosed within semiconductor device housing 1 is a semiconductor element 8 whose major surfaces 6 and 7 are substantially parallel and are joined by means of respective soft solder layers 12 and 11 to the base 2 and top contact electrode 9 respectively. The semiconductor element 8 comprises a body of semiconductor material having at least one PN junction disposed therein.

The top of contact electrode 9 is provided with a spherical segment 10 which presses against cover 3.

The interior contact pressure required to stabilize the solder layers for the semiconductor element and the outer contact pressure between the device housing 1 and the current supply lead 5 is achieved by means of a spring element which consists, for example, of two disc springs 18 and 19. These press, through the intermediary of a top current supply lead 17, on the cover 3, the arrangement being such that the springs press, via an insulating disc 21, against a cap 22 which is made, for example, out of steel, and which is attached to current supply lead 5 by means of tabs (claws) 23. Located between insulating disc 21 and the top of spring element 19 is a pressure plate 20 which serves to distribute the pressure uniformly over insulating disc 21. However, it is possible to achieve the contact pressure by any other arrangement.

The exterior surface of conical frustrum 14, and the corresponding countersurface 16 of current supply lead 5 are inclined at an angle which is greater than 0° and less than 45°, and preferably greater than 1° and less than 12°, with respect to a line normal to the bottom major surface 6 of semiconductor element 8.

In the present form of construction given by way of example, the angle is about 5°. In this case, with a surface area of about 10 mm² for the semiconductor element, an exterior surface area of about 20 to 30 mm² for the conical frustrum 14 and a force of 10 to 13 (deca Newtons) acting perpendicularly on the housing cover 3, a force of between 120 and 150 dN is obtained which acts perpendicular to the sloping external contact surface. As a result, a pressure of between 1 and 1.5 dN/mm² is obtained for the semiconductor element and between 4 and 7 dN/mm² for the external contact surface 16.

Figure 2:
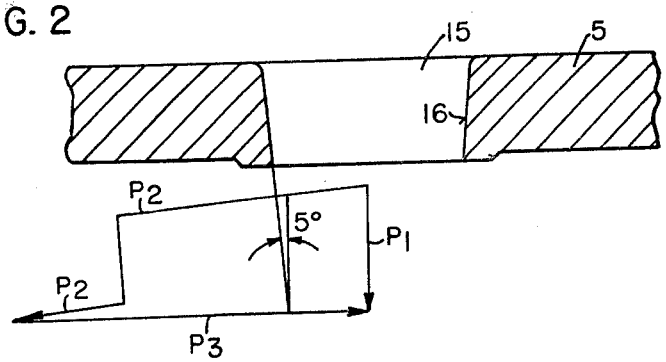
FIG. 2 shows a vertical cross-section of a current supply lead and a diagram of the forces which occur.

This is made evident from the resolution of the forces into its components as shown in FIG. 2. As may be seen, the force acting on the semiconductor element does not exceed the force which would damage the semiconductor element and the solder layer while, on the other hand, on the outer contact between face 16 of current supply lead 5 and the conical frustrum 14, the pressure available is sufficient to break down oxide films.

Figure 3:
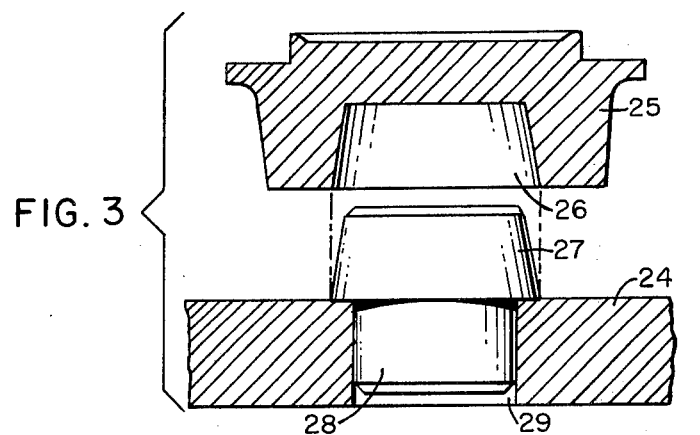
FIG. 3 shows a vertical cross-section through a second form of construction in which, for the sake of simplicity, only a base of the device and part of a current supply lead is shown.

The constructional example shown in FIG. 3 differs from the previous example in that the base 25 of the device housing is provided with a conical recess 26 which is seated the conical frustrum 27 associated with current supply lead 24. This frustrum is force-fitted by means of shank 28 in a hole in current supply lead 24. Current supply lead 24 can also be provided with corresponding stamped-out projection in lieu of the conical frustrum 27.

Figure 4:
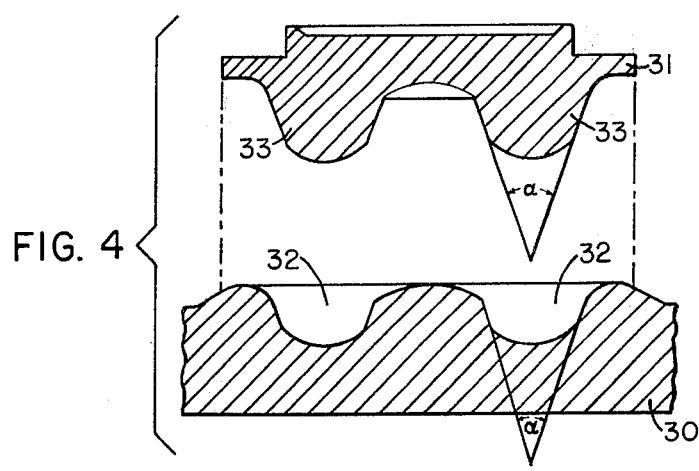
FIG. 4 shows, in a simplified form, a vertical cross-section of a third example of a form of construction.

In the form of construction shown in FIG. 4, the lower side of base 31 of the device housing is provided with a ring-shaped bulge (or beading) 33 whose flanks form the contact faces. Ring-shaped bulge 33 seats in a corresponding ring-shaped groove 32 in a current supply lead 30, the flanks of the ring-shaped groove forming mating surfaces for the flanks of the ring-shaped bulge. The angle shown corresponds to twice the value of the slope of the outer faces with respect to the normals to the major surfaces of the semiconductor element.

Figure 5:
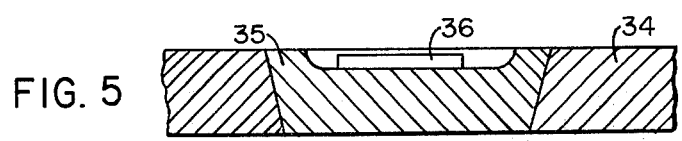
FIG. 5 shows, in a simplified form, a vertical cross-section of a fourth example of a form of construction.

Another form of construction shown in FIG. 5 shows a housing base 35 whose outside surface is itself made in the form of a conical frustrum which seats in a conical recess in a current supply lead 34. In this case, the semiconductor element is indicated schematically by 36.

With the arrangement in accordance with the invention, the external contact pressure is retained as long as the spring element presses the device housing against the current supply lead. A distortion which would be caused by flow (creep) of the housing material, which cannot be neglected in the case of copper, thus has no effect on the electrical and thermal transmission resistance.

What is claimed is:

1. A semiconductor apparatus comprising
    a semiconductor element having top and bottom opposed, substantially parallel major surfaces;
    a top electrode electrically and mechanically connected to said top major surface of said semiconductor element;
    a base member electrically and mechanically connected to said bottom major surface of said semiconductor element;
    a cooling body for removing heat from said semiconductor element through said base member, said cooling body having a surface inclined at an angle to a line normal to said major surfaces of said semiconductor element, said angle being greater than 0° and less than 45° said inclined surface mating with a corresponding inclined surface of said base member; and,
    means retained in said apparatus for exerting and maintaining a force normal to said major surfaces of said semiconductor element, said means applying downward pressure on said top electrode and upward pressure on said cooling body, whereby said semiconductor element is held in compression between said top electrode and said base member, and said cooling is held in compression against said base member at said inclined mating surfaces.

2. The semiconductor apparatus of claim 1 wherein said inclined surface of said base member forms a conical frustrum, and said inclined surface of said cooling body forms a conical recess adapted to receive said conical frustrum.

3. The semiconductor apparatus of claim 1 wherein said inclined surface of said cooling body forms a conical frustrum, and said inclined surface of said base member forms a conical recess adapted to receive said conical frustrum.

4. The semiconductor apparatus of claim 1 wherein said angle lies in a range from 1° to 12°.

5. The semiconductor apparatus claim 1 wherein said force means comprises a spring element held in compression in said apparatus above said top electrode, and a member adapted to receive upward pressure from said spring element and transmit said upward pressure to said cooling body.

6. The semiconductor apparatus of claim 1 wherein said angle is about 5° and said force means exerts a force resulting in a contact pressure of between 1 and 1.5 dN/mm² on said major surfaces of said semiconductor element and a contact pressure of between 4 and 7 dN/mm² on said inclined mating surfaces of said cooling body and said base member.

* * * * *